United States Patent [19]
Mauk

[11] Patent Number: 5,828,088
[45] Date of Patent: Oct. 27, 1998

[54] SEMICONDUCTOR DEVICE STRUCTURES INCORPORATING "BURIED" MIRRORS AND/OR "BURIED" METAL ELECTRODES

[75] Inventor: Michael G. Mauk, Wilmington, Del.

[73] Assignee: AstroPower, Inc., Newark, Del.

[21] Appl. No.: 706,557

[22] Filed: Sep. 5, 1996

[51] Int. Cl.$^6$ ................... H01L 33/00; H01L 31/0232
[52] U.S. Cl. ............... 257/98; 257/432; 257/435; 257/436; 136/259; 438/29
[58] Field of Search ............... 257/98, 432, 435, 257/436, 461, 464; 136/253, 259; 438/29, 32

[56] References Cited

U.S. PATENT DOCUMENTS

| | | | |
|---|---|---|---|
| 4,796,274 | 1/1989 | Akiba et al. | 372/96 |
| 5,038,356 | 8/1991 | Botez et al. | 372/45 |
| 5,221,854 | 6/1993 | Banerjee et al. | 257/431 |
| 5,229,627 | 7/1993 | Kosaka | 257/85 |
| 5,612,229 | 3/1997 | Yoshida | 437/4 |
| 5,626,687 | 5/1997 | Campbell | 136/259 |
| 5,627,426 | 5/1997 | Whitman | 313/116 |
| 5,665,985 | 9/1997 | Iwata | 257/95 |

OTHER PUBLICATIONS

R. Bergmann et al. "Defect–free Epitaxial . . . ," Appl. Phys. Lett., vol. 57, No. 4, 23 Jul. 1990, pp. 351–353.
S. Zhang, et al. "Epitaxial Lateral . . . " Journal of Crystal Growth 99 (1990) 292–296 North Holland.
Tatau Nishinaga et al., "Epitaxial Lateral Overgrowth . . . ," Japanese Journal of Applied Physics, vol. 27, No. 6, Jun., 1988, pp. L964–L967.
N. Nagel et al., "The Coalescence . . . ," Appl. Phys. A57, 249–254 (1993).

*Primary Examiner*—Mahshid D. Saadat
*Assistant Examiner*—Allan R. Wilson
*Attorney, Agent, or Firm*—Connolly & Hutz

[57] ABSTRACT

The invention relates to a device structure and crystal growth process for making the same, whereby single-crystal semiconductor layers are formed over metal or composite layers. The metal layers function as buried reflectors to enhance the performance of LEDs, solar cells, and photodiodes. The structure may also have application to laser diodes. The structures are made by a modification of a well-established metallic solution growth process. The lateral overgrowth process can be enhanced by imposing an electric current at the growth interface (termed liquid-phase electro-epitaxy). However, the use of an electric current is not crucial. The epitaxial lateral overgrowth technique was also applied to silicon growth on metal-masked silicon substrates.

1 Claim, 2 Drawing Sheets

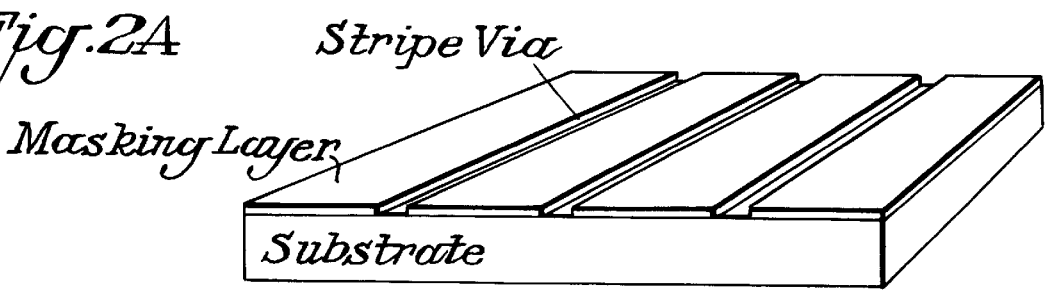
Fig. 2A. Stripe Via / Masking Layer / Substrate
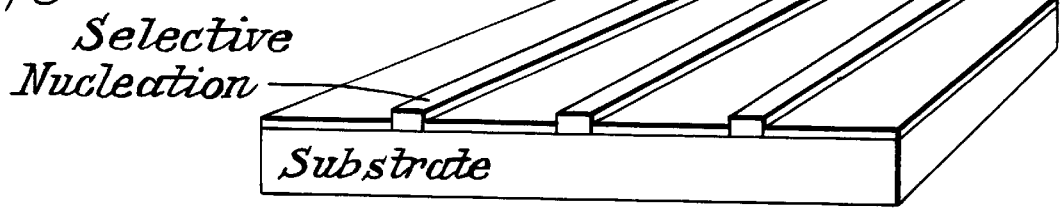
Fig. 2B. Selective Nucleation / Substrate
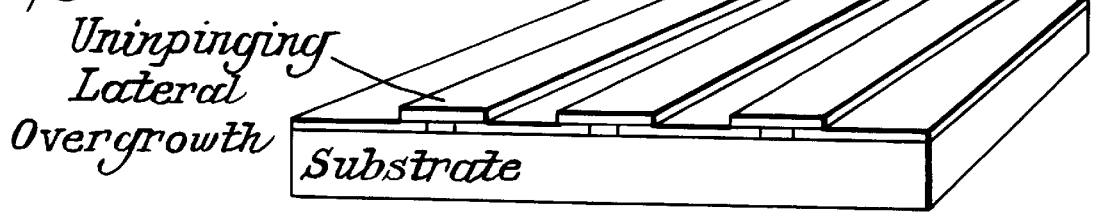
Fig. 2C. Unimpinging Lateral Overgrowth / Substrate
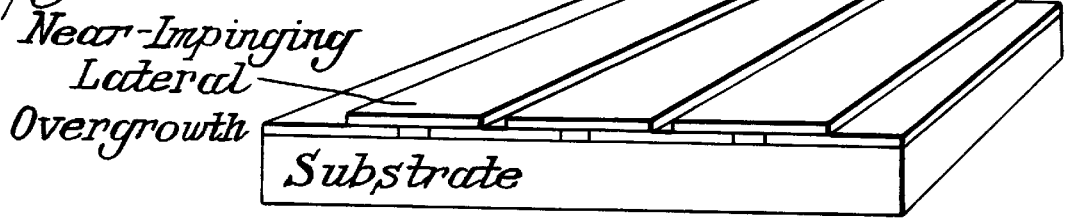
Fig. 2D. Near-Impinging Lateral Overgrowth / Substrate
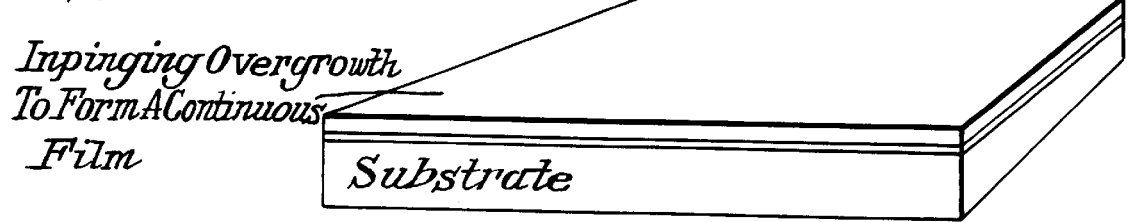
Fig. 2E. Impinging Overgrowth To Form A Continuous Film / Substrate

SEMICONDUCTOR DEVICE STRUCTURES INCORPORATING "BURIED" MIRRORS AND/OR "BURIED" METAL ELECTRODES

FIELD OF THE INVENTION

This invention relates to the field of art for producing semiconductor electronic and optoelectronic devices, especially light-emitting diodes (LEDs), laser diodes, solar cells, photodiodes, photodetectors, and integrated circuits.

BACKGROUND OF THE INVENTION

The utility of many semiconductor optoelectronic devices is based on their efficiency in converting input electrical power into output optical power, as for example, in light-emitting diodes (LEDs) or laser diodes; or conversely, on their efficiency in converting input optical power into output electrical power, as for example, in photovoltaic solar cells or photodiodes. This invention relates both to 1. semiconductor device designs in which these conversions can be effected more efficiently, and 2. processes for fabricating such devices.

Light-Emitting Diodes

Light-emitting diodes (LEDs) are semiconductor devices that convert electrical power into optical power. They are used for, among other things, displays, indicator lights, and fiber optic light sources. The operation of a light emitting diode is based on physical phenomena that are well understood and quantitatively characterized.

In LEDs, light of a specified wavelength range is generated by radiative processes in which an excess (non-equilibrium) number of minority charge carriers (i.e., electrons in material of p-type conductivity; or holes in material of n-type conductivity) combine with majority charge carriers (i.e., holes in material of p-type conductivity; or electrons in material of n-type conductivity), emitting photons with a characteristic energy close to that of the bandgap of the material. This radiative phenomena is especially efficient in certain semiconductors, and in particular in III–V compound semiconductors such as gallium arsenide (GaAs), indium phosphide (InP), gallium nitride (GaN), their related alloys such as aluminum gallium arsenide (AlGaAs), aluminum gallium indium phosphide (AlGaInP) and indium gallium nitride (InGaN), in II–VI compound semiconductors such as zinc selenide (ZnSe), zinc sulfide (ZnS) and related materials, and less efficiently in other semiconductors such as silicon carbide (SiC). The emission spectrum or color of the generated light is determined to a large degree by the bandgap of the semiconductors and to a lesser degree by impurity doping.

One of the most efficient means to produce an excess concentration of minority carriers in a semiconductor utilizes the mechanism of minority carrier injection. By applying a voltage to a junction formed between two judiciously chosen materials, at least one of which is a semiconductor, an excess concentration of minority carriers in an excited energy state can be created in the semiconductor. These injected excess minority carriers combine with majority carriers (which are present due to impurity doping of the semiconductor). A fraction of the recombination phenomena is radiative in that a photon of light is generated for some fraction of recombination events.

The most common device for the purpose of injecting minority carriers is the p-n junction diode which designates the structure formed between a material which exhibits p-type conductivity (conduction primarily by positive charge carriers, i.e., holes) and a material which exhibits n-type conductivity (conduction primarily by negative charge carriers, i.e., electrons). Other structures for injecting minority carriers are metal-semiconductor junctions (Schottky barriers), and metal-insulator-semiconductor (MIS) junctions. Although Schottky or MIS junctions are not as efficient for minority carrier injection as p-n junctions, they are sometimes used for LEDs in cases where the choice of semiconductor material makes it difficult or impossible to form a p-n junction Some of the minority carriers so injected into a luminescent semiconductor material such as GaAs combine with majority carriers (which are present at a relatively high concentration due to impurity doping) through various radiative (i.e., luminescent or light-emitting) processes. Other minority carriers combine with majority carriers by non-radiative processes and such processes represent a loss in LED efficiency.

The light generated by the radiative processes is isotropic in the sense that there is no preferred direction of the luminescence. Because of the high refractive index of most semiconductors, only a relatively small fraction (5 to 10%) of the generated light can escape through the front surface. Most of the light which is not at near-normal incidence to the front surface is internally reflected from the front surface. It is only the fraction of generated light that is transmitted through the front surface that constitutes the useful optical output of the LED. The remaining light is confined and undergoes multiple internal reflections and is mostly re-absorbed in the epitaxial layers, in the substrate, or at metal contacts. This re-absorption of luminescence is a major loss factor in LEDs.

To assess the importance of various loss mechanisms, it is instructive to view the total or overall efficiency $\eta_{TOT}$ of an LED as the product of three efficiency components:

$$\eta_{TOT} = \eta_{INJ} \cdot \eta_{RAD} \cdot \eta_C$$

The injection efficiency is the fraction of electrical current which constitutes the injected minority carriers. In heterojunction LEDs, the injection efficiency can be close to 1. The radiative efficiency is the fraction of injected minority carriers which undergo radiative combination with emission of a photon. In well-developed LED materials, such as GaAs, the radiative efficiency can also be close to 1. In conventional LEDs, the coupling efficiency is typically on the order of 0.01 to 0.1. As described previously, this is a consequence of the isotropic nature of the luminescence and the high refractive index of semiconductors, such that only a small fraction of the luminescence escapes through the front surface of the LED. It is obvious that any further significant improvements in LED efficiency must come by way of improvements in the coupling efficiency.

Approaches to reduce the coupling losses include structuring, "lensing" or texturing the front emitting surface of the LED. In practice, these techniques are too complicated for low-cost LED production or do not sufficiently improve over-all LED efficiency to justify their use in commercial LEDs.

In its application to LEDs, the invention relates primarily to improvements in coupling efficiency. It is an object of the invention to incorporate features in the LED structure, which result in dramatic enhancement of the coupling efficiency. In particular, a reflecting layer sandwiched between the luminescent semiconductor layers and the supporting semiconductor substrate and which we term a "buried mirror" is used to improve the LED coupling efficiency. The buried mirror reduces absorption losses and enhances so-called photon recycling effects. Photon recycling refers to phenomena whereby luminescent photons are absorbed in the semiconductor material, thus generating new minority carriers which in turn recombine radiatively to generate photons. These additional photons produced by photon recycling effects can make a significant contribution to the optical power output of the LED. The buried mirror design effectively enhances and exploits recycling phenomena in LEDs as described by SCHNITZER et al. in *Applied Physics Letters* 62, 2 1993.

In the buried mirror LED design, the thickness of the epitaxial device layers can be adjusted to form a resonant optical cavity. Such a resonant cavity can be used to provide narrower emission angles, narrower emission spectral widths, increase quantum efficiencies, and increase modulation speeds.

Solar Cells

A solar cell is a device for converting light into electrical power. The invention can be applied to solar cells which are comprised of epitaxial layers as is common with GaAs-based solar cells, or less commonly, with silicon solar cells. The use of a buried mirror can improve the performance of a solar cell in several ways. The absorption of light in the solar cells can be enhanced since weakly absorbed light that is normally transmitted into or through the substrate is reflected back into the active layers of the solar cell. Thus, a greater fraction of incident light is absorbed near the semiconductor junction. Photogenerated minority carriers generated close to the junction have a high probability of being collected, thereby reducing minority carrier recombination losses. The enhanced absorption provided by the buried mirror also permits the use of thinner absorbing layers since the optical absorption path is at least doubled. Furthermore, if the top surface of the solar cell is textured, the buried mirror can provide significant light trapping wherein the optical absorption path is increased by a factor much greater than 2. Photon recycling effects can then be very efficiently utilized in improving the device performance. The thinner absorbing layers can also sustain higher impurity dopings which will increase the open-circuit voltage of the solar cell. Solar cells based on thin device layers also have an inherently higher collection efficiency since the minority carriers are photogenerated close to the collecting junction. The solar cell performance is less sensitive to material quality which reduces fabrication costs and increases radiation resistance. Radiation hardness is important for space power applications.

Photodiodes

The advantages of a "buried" metallic reflector for photodiodes are similar to the advantages for solar cells. One additional advantage is related to the bandwidth or response time of a photodiode. The response time, or equivalently the frequency bandwidth, of a photodiode is in part limited by the transit time photogenerated carriers drift or diffuse to the collecting junction. By using a buried mirror, the optically absorbing layers of the photodiode can be reduced without the concomitant loss in photocurrent. A thinner absorbing layer reduces the transit time of photogenerated carriers thereby reducing the response time of the photodiode. The thickness of the optically absorbing semiconductor layer can be adjusted to form a resonant optical cavity. By forming a resonant cavity, the quantum efficiency of a photodetector can be increased by a factor of almost two. The spectral response can also be made more selective by use of such resonant cavities.

Laser Diodes

Vertical cavity surface emitting lasers are comprised of an optical cavity formed between one or two Bragg reflectors. The Bragg reflector is a multilayer stack of alternating dielectric or semiconductor materials of distinct refractive indexes and quarter wavelength optical thicknesses. For semiconductor devices, a Bragg reflector is made by growing multiple epitaxial layers of lattice-matched semiconductor materials. There are three criteria for selecting materials as components of a Bragg reflector. The materials must be relatively non-absorbing to light at the wavelengths of interest. The materials must exhibit a significant difference in refractive index in order to effect high reflectivity with a reasonable number of layers. The materials must be chemically compatible and have a close lattice mismatch in order that the epitaxial semiconductors of device quality may be formed over the Bragg reflector.

The buried reflector approach described herein provides an alternative structure when the above criteria cannot be easily met in epitaxial devices. For example, for some material systems of much interest, such as quaternary InP-based semiconductors, the refractive index change between the component layers of the Bragg reflector is not sufficient to effect an efficient reflector. In optoelectronic devices that operate at long wavelengths, the requirement of quarter-wavelength thick layers leads to impractically thick Bragg reflectors.

Permeable Base Transistors

The permeable base bipolar transistor is comprised of a metal or metallic compound base layer sandwiched between two semiconductor layers that serve as the emitter and collector of the transistor. These transistors are expected to perform at exceptionally high switching speeds compared to conventional bipolar transistors which utilize a semiconductor base region. The proposed fabrication technology, wherein a single-crystal semiconductor layer is formed over a metal film, can produce the device structures required for such permeable base bipolar transistors.

Epitaxial Lateral Overgrowth on Specially Masked Substrates

A further object of the invention relates to crystallization technique for forming single-crystal semiconductor layer(s) over metal layers or combinations of metal and dielectric layers. It is generally not possible to crystallize a device-quality, single-crystal semiconductor layer directly on a metal or dielectric film. This is due primarily to the fact that the metal or dielectric film are neither monocrystalline nor lattice matched to any useful semiconductor materials. Other methods for forming semiconductor layers on oxides often involve some type of selective melting of a deposited amorphous or polycrystalline overcoating of the oxide and subsequent controlled recrystallization. While these are workable for silicon and germanium, they are not feasible with many compound semiconductors due to the incongruent vaporization of compound semiconductors. An important facet of this invention is the development of a relatively low-temperature liquid-phase lateral epitaxy process for forming single-crystal epitaxial layers on reflective masked substrates wherein the epitaxial semiconductor crystals so formed have dimensions that are useful and optimal for semiconductor devices.

SUMMARY OF THE INVENTION

This invention relates to improvements in semiconductor optoelectronic devices which can be effected by incorporating a reflective layer, which is referred to as a buried mirror between the epitaxial device structure and semiconductor substrate. In light emitting diodes, the buried mirror improves efficiency by reducing parasitic optical absorption and enhancing photon recycling effects.

BRIEF DESCRIPTION OF THE DRAWINGS

FIG. 2 shows the fabrication process schematic wherein the substrate is masked with a reflective coating (such as a metal or composite multilayer structure) and patterned with stripe openings. Various stages of preferential nucleation and lateral overgrowth are indicated.

DETAILED DESCRIPTION

In accordance with the teachings of this invention, a liquid-phase epitaxy process is employed to produce semiconductor device structures that incorporate a metal layer, or composite of metal and dielectric layers, between epitaxial layers and/or epitaxial layers and the substrate.

Figure 1A:
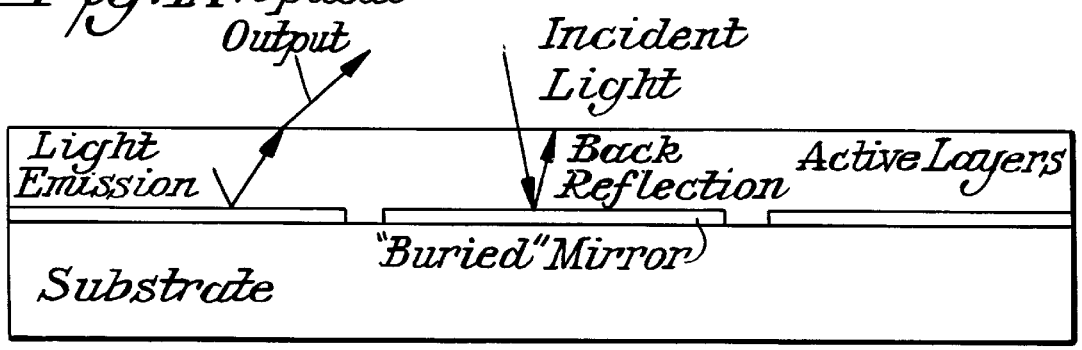
FIG. 1 shows a generic embodiment of the invention wherein a single or multilayer epitaxial device structure is crystallized on a substrate which is masked with reflecting layers. The thickness of the epitaxial structure can be selected so as to form a resonant optical cavity.
Figure 1B:
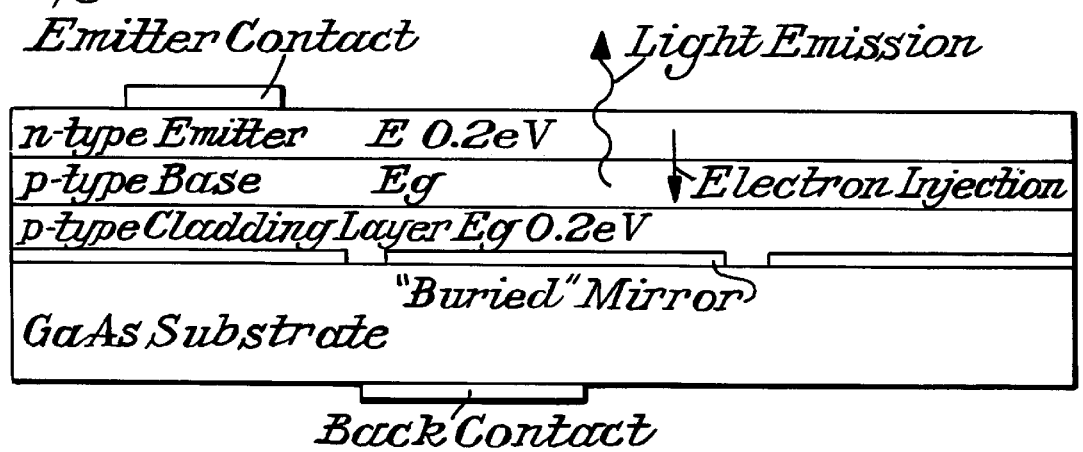

FIG. 1a shows the formation of the buried mirror adjacent to the substrate with a single epitaxial layer formed thereon. FIG. 1b shows the buried mirror formed adjacent to the substrate with a plurality of epitaxial layers thereon.

FIGS. 2a–e show successive stages of the epitaxial lateral overgrowth process such as for forming the devices of FIG. 1. FIG. 2a is the substrate masked with the buried reflector layer(s) and patterned with stripe vias wherein the underlying substrate is exposed. (FIG. 2a is the appearance of the substrate just prior to the epitaxial growth step.) During the initial stages of growth, the semiconductor layer is selectively (i.e., preferentially) nucleated in the vias as shown in FIG. 2b. FIG. 2c and 2d show subsequent stages of the process wherein a higher degree of lateral overgrowth over the mask has been achieved. FIG. 2e shows impinging overgrowth to form a continuous film.

Referring to FIG. 2, a semiconductor substrate is masked with metal, dielectric, or a multilayer combination of metals, semiconductors, and/or dielectrics. The so-called (111) crystallographic orientation of the substrate is best suited for the lateral overgrowth process, but other substrate orientations, such as for example (100) and (110), are also workable. As shown in FIG. 2A the mask is patterned with stripe openings using standard photolithography and selective etching techniques. The stripe openings in the mask expose underlying substrate. The areas of exposed substrate serve as sites of preferential nucleation during the subsequent liquid-phase epitaxy process. See FIG. 2b. Therefore, the exposed areas must be wide enough to ensure adequate wetting of the substrate area by the growth solution. The stripe openings can vary in width between several microns to 50 microns or larger. The spacing between the stripe openings may range from ten to hundreds of microns depending on the device application. For light-emitting diodes, for example, a stripe width of ten microns and a stripe spacing of 250 or 400 microns is used. The alignment of the stripes on the wafer surface is also an important factor in optimizing the lateral overgrowth. For instance, on (111) oriented GaAs substrates, crystals grown from stripe openings aligned along <112> directions will exhibit much greater lateral overgrowth of the mask than crystals grown from stripe openings aligned along the <110> direction for which the extent of lateral overgrowth is rather small. Similar optimizations of stripe opening alignments are observed on other crystallographic orientations and other substrate materials. FIGS. 2c–2e show the various stages in lateral overgrowth. The lateral overgrowth can be enhanced by imposing an electric current at the growth interface (termed liquid-phase electro-epitaxy, patented by Gatos of MIT) although the use of an electric current is not crucial.

A number of metals, semiconductors, and dielectrics are suitable as mask materials. The choice of a mask material or the combination of materials used in a multilayer mask is dictated by a number of considerations, which are discussed below.

The mask must be compatible with the substrate at process temperatures which may be as high as 850° C. for epitaxial lateral overgrowth of GaAs-based materials and even several hundred degrees higher for epitaxial lateral overgrowth of silicon, silicon carbide, or gallium nitride. Many metals and semiconductors films exhibit a strong tendency to alloy or chemically react with semiconductor substrates and therefore, the bottom layer of the mask which is in contact with the substrate must be chosen to avoid alloying or reaction with the substrate.

The mask material may also dissolve or react with the metallic solution from which the semiconductor epitaxial layers are crystallized. In the case of epitaxy of aluminum gallium arsenide, the growth solution is a molten mixture of gallium, aluminum, bismuth, tin, and other metals. Such melts are quite reactive, and therefore, the top mask layer which is in contact with the melt must be selected in order to ensure its integrity throughout the liquid-phase epitaxy process. With the same objective, the melt can be formulated in order to avoid dissolution or chemical reaction with the mask material.

One motivation for the use of a multilayer mask is to use a combination of materials in which the top layer serves a metallurgical barrier preventing dissolution of the mask by the melt and the bottom layer of the mask functions as a metallurgical barrier preventing reaction or alloying of the mask with the substrate. The mask can also be designed as diffusion barrier to reduce contamination of the melt or epitaxial layers from components of the mask or substrate.

Another consideration is thermal stress effects caused by the unequal thermal expansion of the substrate, mask layers, and epitaxial layers. During heat up to or cool down from process temperatures, thermal stress may cause the mask layer(s) to crack or peel.

From the perspective of device performance, the most important aspect of the mask is its reflectivity. The reflectivity of the mask is a function of its component materials and layer thicknesses. Refractory metals, such as tungsten or molybdenum, are fair reflectors in the wavelength range of 600 to 1000 nm. Their reflectivity often improves at longer wavelengths. Aluminum, gold, and silver have high reflectivities over a broad range of wavelengths, but their incorporation in a mask is problematic due to their relatively low melting points and reactivities. The compatibility of a mask and its reflectivity is thus a critical issue.

A Bragg reflector is comprised of a stack of alternating dielectric or semiconductor layers with different refractive indices. The layer thicknesses are selected to optimize the reflectivity for a specified spectral range. The theory and design of Bragg reflectors (also called interference filters) is well known.

The next step in the process is liquid-phase epitaxial lateral overgrowth. The patterned, masked substrates are utilized as seeds in a liquid-phase epitaxy process which is similar to conventional liquid-phase epitaxy technology except in several important respects. In the case of aluminum gallium arsenide, the melt composition optimizes the lateral overgrowth process.

Additional epitaxial layers can be grown on the initial overgrown layer following procedures developed for conventional liquid-phase epitaxy. For light-emitting diodes, solar cells, and laser diodes, a double heterostructure (comprised of at least three layers of semiconductors with appropriate bandgaps) is most useful.

To increase light trapping effects, the front surface can be structured or textured.

For the case of AlGaAs-based devices formed on masked substrates for epitaxial lateral overgrowth, I have found a particular composition of the solution from which AlGaAs is grown is especially conducive to lateral overgrowth.

$Al_xGa_{1-x}As$ epitaxial layers are traditionally grown from Ga-rich melts with a small amount (less than 1 atomic percent) of aluminum and which are saturated with arsenic (which usually amounts to a few atomic per cent or less).

In contrast, I have found for purposes of lateral overgrowth of AlGaAs, a bismuth-rich solution has several advantages. First, bismuth-rich solutions are less reactive than gallium-rich melts which provides greater compatibility with more mask materials. Second, molten bismuth has a lower surface tension than molten gallium, so the bismuth-rich melt shows better wetting of the mask and exposed regions of the substrate.

Most importantly for liquid-phase epitaxial lateral overgrowth of $Al_xGa_{1-x}As$, the aspect ratio (which is defined as the ratio of the width of lateral overgrowth to layer thickness) which is a figure of merit for lateral overgrowth, can be greatly enhanced by using a bismuth-rich, Bi-Ga mixture as the solvent. Specifically, I had experimentally determined that at growth temperatures of 650° to 900° C., using a growth solvent comprised of 90 atomic % bismuth and 10 atomic % gallium, saturated with As, and with an appropriate small percentage of aluminum yielded aspect ratios two to four times greater than more commonly used melts based on gallium-rich melts.

The above description was focused primarily on GaAs-based semiconductor devices. The device structures and processes are applicable to devices made in other materials. The extension of the process and device designs to other III–V and II–VI compound semiconductors and optoelectronic devices is straight-forward. Silicon device structures can also be formed with buried mirrors. These devices include silicon solar cells, silicon photodiodes, porous silicon LEDs and solar cells, and rare-earth doped silicon LEDs.

FIG. 1b shows a double heterostructure LED.

The concept of a resonant cavity LED, and this particular structure and fabrication process, should be applicable to a wide range of semiconductor materials. As illustrated the device could be for a surface-emitting $Al_{0.5}Ga_{0.5}As/Al_xGa_{1-x}As/Al_{0.5}Ga_{0.5}As$ LED. The active layer aluminum composition x can be varied from 0 to 0.35. The emission wavelength can range from 650 to 900 nm, depending on the aluminum fraction of the active layer.

The device structure of FIG. 1b is comprised of a GaAs substrate, which is masked with a reflective coating. Any suitable number of reflective coatings, including refractory metals and multilayer coatings of various dielectrics, semiconductors, and metals may be used. The coating is patterned with strip openings, called vias. Next, a three-layer double heterostructure is formed on the masked substrate by a process termed epitaxial lateral overgrowth. The double heterostructure is an active luminescent layer sandwiched between two wider bandgap cladding layers similar to conventional AlGaAs LEDs. The top (light-emitting) surface of the LED is coated with dielectric films to modify the front surface reflectivity. This may be required to form the resonant optical cavity. The top surface coating can also function as current spreading layer. Conducting oxides, such as $In_2O_3$, are finding use in this regard.

The realization of the proposed structure is predicated on:
1. the formation of a patterned, reflective masking layer on the substrate, 2. epitaxial lateral overgrowth of semiconductor layers, and 3. control of the optical thickness of the structure in order to achieve a resonant optical cavity.
1. Buried Reflector Mask The masking layer must function as a "mirror" with high reflectance. For long wavelengths (>2 microns), refractory-metals, such as tungsten, appear satisfactory. Higher reflectivities are achieved with Bragg reflectors based on multiple alternating layers of silicon and silicon dioxide. Reflectivities over 95% have been achieved.
2. Epitaxial Lateral Overgrowth With liquid-phase epitaxial lateral overgrowth of AlGaAs on patterned, masked GaAs substrates, the lateral overgrowth characteristics are sufficient to produce resonant cavity AlGaAs LEDs.
3. Optical Thickness Control The resonant cavity can be formed, in part, by controlling the thickness of the top AlGaAs cladding layer. The cladding layer thickness can be monitored with a surface profiler or by elipsometry. The feasibility of modifying the luminescence characteristics (spectral width, intensity, directionality) by the presence of a resonant optical cavity may be checked by photoluminescence studies. A structure, such as shown in FIG. 1, is made with a thick top AlGaAs cladding layer. The cladding layer can be etched intermittently by repeated etchings. Between etching the thickness of the cladding layer and the photoluminescence characteristics are measured. This will show the effect of cavity dimensions and finesse on the luminescence phenomena.

Figure 3:
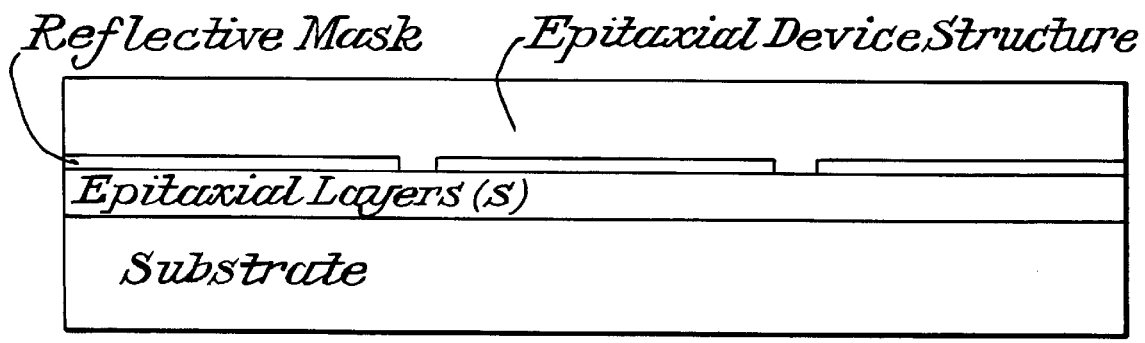
FIG. 3 is a view similar to FIG. 1 showing the mask situated between epitaxial layers.

FIG. 1 shows the mask located at the substrate. The mask can alternatively be situated between epitaxial layers as shown in FIG. 3. In this case, a substrate with epitaxial layer(s) is masked. The mask is patterned with via openings. A second epitaxial structure is formed over the mask by epitaxial lateral overgrowth.

One application where this technique is useful is for growth on lattice-mismatched substrates. As a specific example, a GaAs layer can be grown directly on a silicon substrate by chemical vapor deposition or molecular beam epitaxy. This epitaxial layer is masked and patterned with via openings. An AlGaAs multilayer device structure is formed over the mask by epitaxial lateral overgrowth. In this case most of the defects associated with lattice mismatch and thermal expansion mismatch between GaAs and silicon are blocked by the mask and/or confined to the first epitaxial layer and do not propagate into the epitaxial material above the mask.

Formation of Metal and Dielectric Layers as Multiple Layers

A multilayer mask can be used as the reflective layer. Such a mask is comprised of a stack of thin films of different materials. The component layers are films of metal, dielectric, or semiconductor materials, and may also include compounds of metals such as metal silicides, metal oxides, metal carbides, and metal nitrides, or other inhomogeneous mixtures such as cermets. The use of several reflector component layers instead of a single layer permits further optimization of the buried reflector. For example, alternating layers of two materials with high and low refractive (each with quarter-wavelength thickness) produce a very effective reflector. The use of multilayers also improves the compatibility of the mask with the substrate and growth process. For instance, a particular mask layer may function as a metallurgical barrier to prevent interdiffusion of mask components or dissolution of the underlying mask layers in the growth solution.

The multilayer mask structure can be formed by sequential thin-film deposition processes appropriate for the materials being deposited. These techniques include thermal evaporation, electron-beam evaporation, chemical vapor deposition, electroplating, sputtering, anodic or thermal oxidation, or deposition from liquid solutions.

The via opening in the deposited reflective mask can be defined using a so-called shadow mask which is a thin lamina that covers the substrate during deposition of the reflective mask layer. Here, openings in the shadow mask result in selective deposition of the reflective mask layer. The opaque regions of the shadow mask correspond to regions of no deposition and thus provide the via openings in the deposited reflective mask.

The preferred method for forming vias in the deposited reflective mask, however, is photolithographic patterning. Two approaches are possible. In one approach, the deposited mask structure is coated with photoresist which is exposed and developed to define a via pattern. The mask can be selectively etched to define the via openings by an appropriate liquid etchant or vapor- or plasma-phase etchant. For multilayer masks, several etching and/or several photolithography steps may be required. In another technique, called photolithographic lift-off, the photoresist is applied first and patterned as in the usual manner. The mask layers are deposited over the photoresist. The photoresist is then removed by dissolution and areas of the mask formed over the photoresist are removed as well, thus providing via openings in the mask layers.

All of these deposition and patterning processes are well known in the field and are established technology of semiconductor device fabrication.

The photolithography lift-off technique described above for defining the via openings has an important advantage in that it can be used to recess the mask.

The epitaxial lateral overgrowth process uniquely permits a wide variety of reflector materials. Multilayer $Si/SiO_2$ structure functions as a Bragg reflector. The Bragg reflector can be "tuned" for maximum reflectivity at a specified wavelength band by adjusting the thickness of the component layers. A two-pair (four layers total of alternating layers of Si and $SiO_2$) Bragg mirror has a reflectivity of over 90% The reflector mask is recessed to accommodate thicker reflector masks. A thick mask tends to inhibit lateral overgrowth. This problem is solved by recessing the reflecting mask in a photolithography lift-off process described below.

Recessed Buried Mirror Process

The (111) GaAs substrate is spin-coated with photoresist and a stripe via pattern is defined. The vias are typically 10 microns wide and spaced 400 microns apart.

The substrate is selectively wet etched using a (1:8:500) $H_2SO_4:H_2O_2:H_2O$ solution. This reveals the via as a raised mesa. The solution etch rate for GaAs is 100 nm/min which provides good control. The depth of the recessing ranges from 100 to 5000 nm, as appropriate for the thickness of the reflector mask.

A $Si/SiO_2$ Bragg reflector is deposited by electron-beam evaporation.

The photoresist is dissolved in acetone, lifting off the reflector over the via.

The patterned substrate with the recessed reflector is then used for liquid-phase epitaxial lateral overgrowth.

What is claimed:

1. A semiconductor device structure having a substrate and at least one semiconductor epitaxial layer to form a composite structure, the improvement being in including a buried mirror between said substrate and epitaxial layers, said buried mirror being of non-single crystalline form, said epitaxial layers being formed from epitaxial layer overgrowth to result in a single-crystal epitaxial device over said buried mirror, and said buried mirror is a metal layer between a pair of adjacent epitaxial layers.

* * * * *